(12) United States Patent
Chen

(10) Patent No.: US 7,446,991 B2
(45) Date of Patent: Nov. 4, 2008

(54) ESD PROTECTION CIRCUITS AND RELATED TECHNIQUES

(75) Inventor: Ke-Yuan Chen, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 375 days.

(21) Appl. No.: 11/428,840

(22) Filed: Jul. 6, 2006

(65) Prior Publication Data
US 2007/0132030 A1     Jun. 14, 2007

(30) Foreign Application Priority Data
Dec. 8, 2005   (TW)   .............................. 94143421 A

(51) Int. Cl.
*H02H 9/00*   (2006.01)
(52) U.S. Cl. ....................................................... 361/56
(58) Field of Classification Search ..................... 361/56
See application file for complete search history.

(56) References Cited

U.S. PATENT DOCUMENTS

| | | | |
|---|---|---|---|
| 5,892,262 A * | 4/1999 | Wu et al. ..................... | 257/356 |
| 6,385,021 B1 * | 5/2002 | Takeda et al. ................. | 361/56 |
| 6,650,165 B1 * | 11/2003 | Mallikarjunaswamy ..... | 327/310 |

* cited by examiner

*Primary Examiner*—Stephen W Jackson
(74) *Attorney, Agent, or Firm*—Winston Hsu

(57) ABSTRACT

An electro-static discharge, ESD, protection circuit is disclosed. While protecting an ESD event between a given pad and a ground pad, the ESD protection circuit triggers a clamp for ESD protection according to a voltage difference between the given pad and a power pad. Generally, chips already have capacitance between the power pads and the ground pads, such as capacitance contributed by decoupling capacitors for power regulation. Therefore, when the ESD event happens between the given pad and the ground pad, voltage of the power pad holds to make a voltage difference enough for triggering the clamp. Accordingly, the ESD protection circuit can reduce layout area by taking advantage of the original capacitance of chips.

20 Claims, 13 Drawing Sheets

ESD PROTECTION CIRCUITS AND RELATED TECHNIQUES

BACKGROUND OF THE INVENTION

1. Field of the Invention

The present invention provides ESD (electrostatic discharge) protection circuits and related techniques, and more particularly, a kind of simplified layout to effectively realize the ESD protection circuits and related techniques.

2. Description of the Prior Art

A typical chip is equipped with conductive pads to receive external power potentials and to exchange data with other external circuits/chips. For instance, the chip is equipped with power pads and ground pads to transmit the positive or negative voltage and the ground voltage to the power supplies. Similarly, the chip is also equipped with signal input/output pads (I/O pads) to receive input signals and to transmit output signals.

However, when an ESD event happens, such as human bodies or manufacturing machines accidentally contacting the pad of a chip, the massive electrostatic currents of the ESD power source flow through the pad into the chip. If the circuit structure within the chip is overloaded with the current, it would be burned down and be unable to work normally. Thus, each pad of the chip is generally equipped with an ESD protection circuit. The basic function of the ESD protection circuit is to serve as a conductive path with low impendence between the two pads, so that ESD currents pass by this path instead of other internal circuits of the chip. In this way, the circuits in the chip are protected from ESD events. It is equivalent that the ESD protection circuit shorts the two pads to guide ESD currents into the bypass path instead of the internal circuits in the chip. But, during the regular operation of the chip, the ESD protection circuit turns the current path between the two pads off to avoid interfering in the regular operation of the chip.

In other words, the ESD protection circuit itself distinguishes between an ESD event and the regular operation of the chip in order to avoid activating at incorrect time. To differentiate the two conditions above, the ESD protection circuit determines if it is the normal power-on procedure or an ESD event according to the rising time of the voltage of the pad. During an ESD event, the ESD power source usually leads to the rapid rising of the voltage of the pad, and the rising time of the voltage is about 10 to 100 ns (ns, $1\ ns=10^{-9}$ s). In regular power-on procedure, the voltage of the pad (such as the power pad) rises slower, in which the rising time usually falls on the level of ms (ms, $1\ ms=10-3\ s$). According to the difference of the rising time of the voltage, the ESD protection circuit distinguishes between an ESD event and the regular power-on procedure.

According to the theory above, when the conventional techniques provide a specific pad (such as a power pad), the conventional ESD protection circuit connects a resistor and a capacitor in series to the pad to form a RC network for differentiating different rising times of the voltage of the pad and for determining if an ESD event happens. When an ESD event happens on the protected pad, the voltage of the specific pad rises rapidly, and the rising time of the voltage is lower than the time constant of the RC network (the time constant is the product of capacitance of the RC network and resistance of the RC network). Thus, the RC network does not respond in time to the ESD event, so that the transient voltage of the capacitor keeps steady and the transient difference in voltage across the resistor is rising as the voltage of the specific pad. By the RC network, the conventional ESD protection circuit triggers the ESD clamp circuit to turn on a conductive path for bypassing the ESD current of the protected pad. However, the voltage of the specific pad rises slowly, and the rising time is more than the time constant of the RC network during the regular operation and the power-on procedure of the chip. Thus, the RC network responds to the ESD event in time, and the difference in voltage across the resistor is steady and the difference in voltage across the capacitor is increased as the voltage of the specific pad. Thus, the ESD clamp circuit is turned-off to avoid interfering with the regular operation of the chip.

However, there are disadvantages of the conventional techniques described above. One of the disadvantages is using more layout area. To form the RC network for differentiating between ESD event and the regular operation, the conventional ESD protection circuit is realized with capacitors and resistors of great value, which uses a great deal of layout area. Generally, the time constant of the RC network is about 150 ns to 200 ns in order to differentiate between an ESD event and the regular operation so that big capacitors are necessary. Thus, the conventional ESD protection circuit uses a great deal of layout area, which is a disadvantage of the chip density and increases the cost of chip design.

SUMMARY OF THE INVENTION

The claimed invention discloses a protection circuit that reduces damages caused by ESD events.

The present invention provides a protection circuit for bypassing a current induced by an ESD event. The protection circuit comprises a trigger circuit coupled between a first pad and a second pad for comparing a voltage of the first pad and a voltage of the second pad. The trigger circuit generates a triggering signal when the voltage difference between the first pad and the second pad is exceeds to a first predetermined value. An ESD clamp circuit, which is coupled to the first pad and the third pad, serves as a conductive path between the first pad and the third pad when the controlled node of ESD clamp circuit receives the triggering signal. Because the second pad is coupled to a decoupling capacitor, the voltage of the second pad is lower than the voltage of the first pad by less than the first predetermined value when the ESD event happens between the first pad and the third pad.

The present invention also provides a protection circuit protecting ESD events. The protection circuit comprises a trigger circuit coupled to a first pad and a second pad for comparing the voltages of the first pad and the second pad. The trigger circuit generates a triggering signal when the voltage of the first pad is higher than the voltage of the second pad and the difference between the voltages of two pads is higher than a first predetermined value. An ESD clamp circuit, which is coupled to the first pad and the third pad, provides a conductive path between the first pad and the third pad when receiving the triggering signal. A reverse-control circuit coupled to the second pad generates a reverse-control signal when the difference between a voltage of the second pad and a reference voltage is higher than a second predetermined value; and a reverse-trigger circuit coupled to the trigger circuit and the reverse-control circuit stops the trigger circuit from generating the triggering signal when the reverse-trigger circuit receiving the reverse-control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
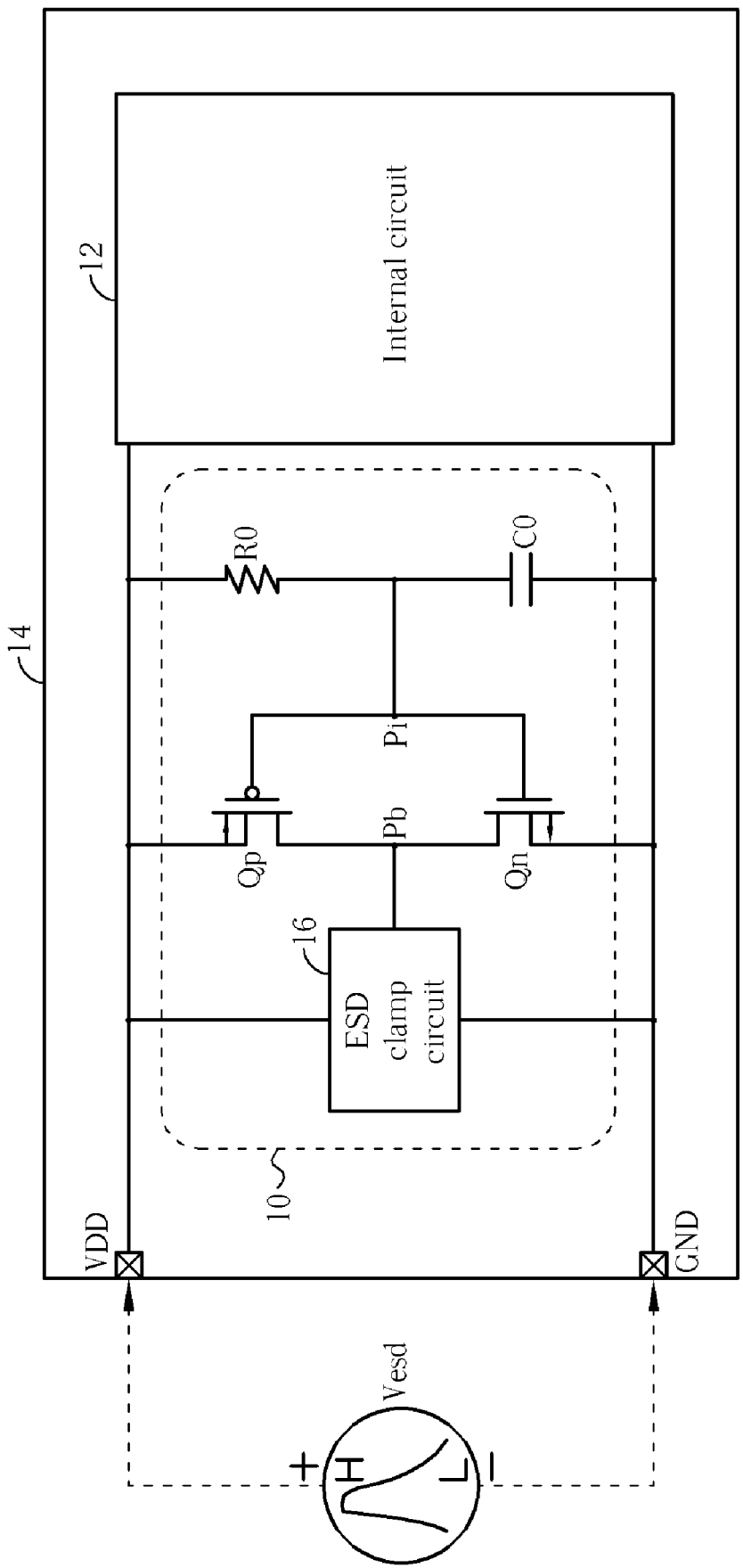
FIG. 1 is a diagram illustrating the ESD protection circuit.

Please refer to FIG. 1, which is a circuit diagram illustrating a conventional ESD protection circuit 10 disposed in a chip 14. The internal circuit 12 comprises core circuits (such as logic gates, operation circuits, processing circuits, and memory circuits) to execute the purposed functions for the chip 14. The pad VDD is a power pad, and the pad GND is a ground pad. Using these two pads, the internal circuit 12 connects the external circuits to provide the necessary electrical potentials. In order to prevent ESD events (such as positive mode power-rail ESD) between the pads VDD and GND, the ESD protection circuit 10 is disposed between these two pads.

As shown in FIG. 1, in the ESD protection circuit 10, a resistor R0 and a capacitor C0 are connected in series to the pads VDD and GND to form a RC (resistor-capacitor) network. A P-type transistor Qp and a N-type transistor Qn are connected to the pads VDD and GND as an inverter. The gates of the two transistors as the input of the inverter are controlled by the voltage at the node Pi of the RC network while the drains of the two transistors as the output of the inverter control the trigger of an ESD clamp circuit at the node Pb. When the node Pi is triggered by the high-leveled voltage, the ESD clamp circuit 16 is turned on as a conductive path with low impendence between the two pads.

However, the ESD protection circuit 10 needs to put a capacitor C0 in the protection circuit 10, the total layout area of the protection circuit 10 substantially increases. Thus it is disadvantageous to apply the protection circuit 10 to a high density of chips.

Figure 2:
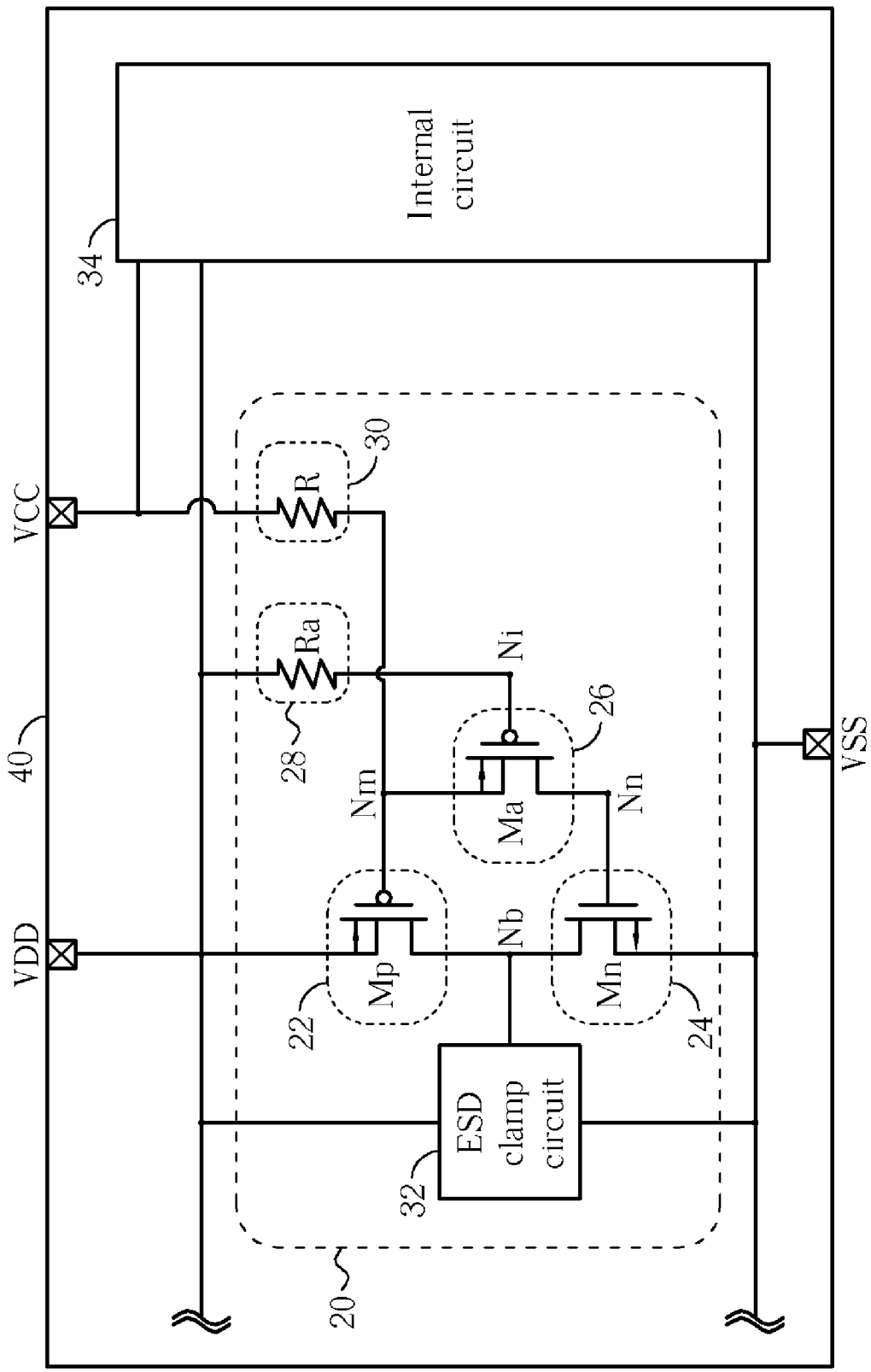
FIG. 2 is a diagram illustrating a circuit placement of an embodiment of the protection circuit of the present invention.

Please refer to FIG. 2, which is a circuit diagram illustrating an embodiment 20 of the present invention. The protection circuit 20 is disposed in the chip 40 which is equipped with the two power pads VCC and VDD, and a ground pad VSS. The pads are used to enable the chip 40 to receive external power sources. When the chip 40 regularly works, the pads VCC and VDD provide different positive voltages for the internal circuit 34, and the pad VSS is for grounding the internal circuit 34. For instance, the pad VCC may be the voltage of approximately 3.3 volts, and the pad VDD may be the voltage of approximately 2.5 volts, and that provides the driving voltages which different sub-circuits of the internal circuit 34 need. In order to protect the internal circuit 34 against ESD events between the pad VDD and the pad VSS, the present invention equips the protection circuit 20 between the pad VCC, the pad VDD, and the pad VSS. For the embodiment of FIG. 2, the pad VCC is used to receive higher voltages while the pad VDD is used to receive lower voltages.

In general, chips connect big capacitors (such as decoupling capacitors) between power pads and ground pads for the voltage stabilization during regular operation of chips and resisting any noise of the power supplies such as simultaneous switching noise. Since the chip itself connects big capacitors between power pads and ground pads, the present invention directly uses these intrinsic capacitors and the equivalent capacitance effect to realize the RC network for the ESD protection circuit. In the embodiment of FIG. 2, the present invention uses the intrinsic capacitors between the pads VCC and VSS to realize the ESD protection techniques of the present invention.

In the embodiment of the FIG. 2, the protection circuit 20 of the present invention is equipped with a trigger circuit 22, a reverse-trigger circuit 24, a reverse-control circuit 26, a transmission circuit 30, an adjustment circuit 28, and an ESD clamp circuit 32 between the pads VDD and VSS. The node Nb is the controlled node of the ESD clamp circuit 32. When the ESD clamp circuit 32 receives a triggering signal with high-leveled voltage from the controlled node Nb, the ESD clamp circuit 32 is turned on as a conductive path with low resistance between the pads VDD and VSS. Otherwise, the ESD clamp circuit 32 is turned off. And the trigger signal of the node Nb is controlled by the trigger circuit 22 and the reverse-trigger circuit 24. The trigger circuit 24 connects to the pad VDD, and connects to the pad VCC through the transmission circuit 30. By transmitting through the transmission circuit 30, the trigger circuit 24 receives the voltage of the pad VCC, and compares with the voltage of the pad VCC and that of the pad VDD. When the voltage difference between the pads VDD and the VCC exceeds a first predetermined value, the trigger circuit 22 generates a triggering signal to the ESD clamp circuit 32. The reverse-control circuit 26 connects to the pad VCC through the transmission circuit 30, and also connects to the pad VDD through the adjustment circuit 28. The adjustment circuit 28 provides a reference voltage according to the voltage of the pad VDD. In the embodiment, the adjustment circuit 28 directly refers to the voltage of the pad VDD as the reference voltage. When the voltage of the pad VCC is higher than the reference voltage, and the difference of them exceeds a second predetermined value, the reverse-control circuit 26 generates a reverse-control signal at the node Nn. Moreover, the reverse-trigger circuit 24 connects to the reverse-control circuit 26 at the node Nn. When the reverse-control circuit 26 generates the reverse-control signal, the reverse-trigger circuit 24 and the trigger circuit 22 stop generating triggering signals to the ESD clamp circuit 32 at the same time.

As the embodiment shown in FIG. 2, the trigger circuit 22 is a PMOS transistor Mp while the reverse-trigger circuit is an NMOS transistor Mn, and the transmission circuit 30 and the adjustment circuit 28 are respectively the resistors R and Ra. The source of the transistor Mp connects to the pad VDD while the gate of the transistor Mp connects to the pad VCC through the resistor R. The gates of the transistors Mn and Mp connect to the node Nb to control the trigger of the ESD clamp circuit 32. On the other hand, the reverse-control circuit 26 is another PMOS transistor Ma, and the source of the transistor Ma connects to the pad VDD through the resistor Ra while the gate of the transistor Ma connects to the pad VCC through the resistor R. The gate of the transistor Ma controls the reverse-control circuit 24 with the reverse-control signal at the node Nn. Please note that the protection circuit 20 of the present invention does not need capacitors like the conventional protection circuit 10 to realize the RC network.

More particularly, the adjustment circuit 28 connects to the pad VDD and the gate of the reverse-control circuit 26 to provide a reference voltage to the reverse-control circuit 26. When the voltage of the pad VCC is higher than the reference voltage and the difference is more than a second predetermined value, the reverse-control circuit 26 generates a reverse-control signal at the node Nn. Otherwise, the reverse-control circuit stops generating the reverse-control signal. In the present embodiment, the second predetermined value is the threshold voltage of the PMOS transistor Ma|Vth-Ma|. The reverse-trigger circuit 24 connects to the reverse-control circuit 26 at the node Nn. When the reverse-control circuit 26 generates the reverse-control signal, the reverse-trigger circuit 24 and the trigger circuit 22 together stop generating triggers to the ESD clamp circuit.

Besides, the resistor Ra of the adjustment circuit 28 prevents currents of the ESD events or abnormal operation from directly passing by the reverse-control circuit 26. Similarly, the resistor R of the transmission circuit 30 prevents the currents of abnormal operation from directly passing by the trigger circuit 22.

Figure 3:
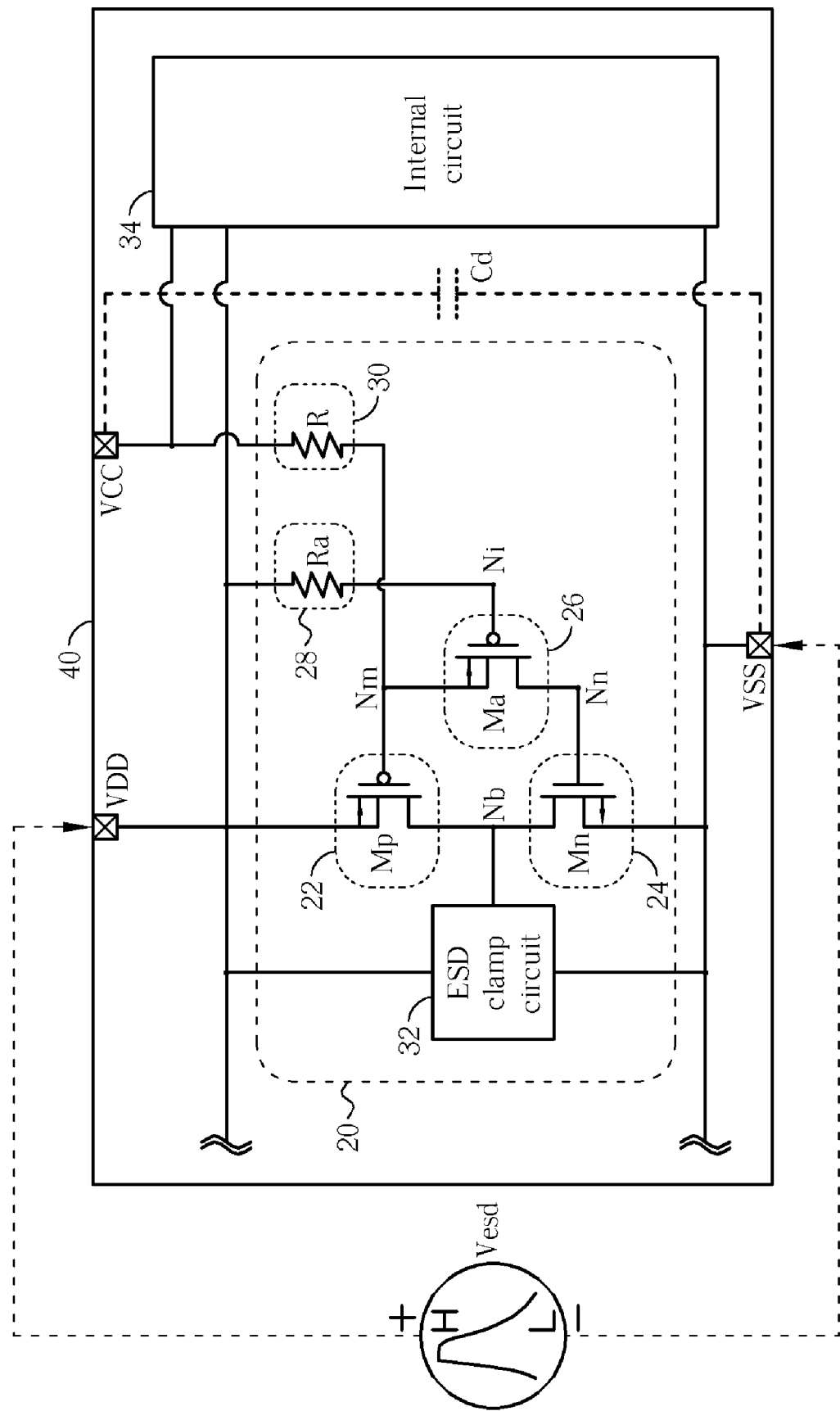
FIG. 3 is a diagram illustrating ESD events happening to the circuit in FIG. 2.

With regard to the operation of the protection circuit 20 of the present invention, please continue referring to FIG. 3 together with FIG. 2. Following the embodiment of FIG. 2, FIG. 3 illustrates the case of ESD events happening to the chip 40 of FIG. 2. When the chip 40 accidentally contacts an ESD power source Vesd and an ESD event happens, the voltage across the pads VDD and VSS rises rapidly. In other words, the pad VSS serves as the ground of the Vesd, and the voltage of the pad VDD rapidly rises. And the voltage of the pad VCC keeps at a low voltage comparing with the voltage of VDD. As discussed above, the intrinsic capacitor between the pads VCC and VSS (such as decoupling capacitors) is equivalent to the capacitor Cd of FIG. 3. When ESD events happen between the pads VDD and VSS, the pad VCC is taken as floating and then the capacitor Cd and the resistor R of the transmission circuit 30 form a RC network naturally. When the voltage of the pad VDD rises rapidly, the RC network keeps the voltage of the pad VCC at a low voltage temporarily so that the gate of the transistor Mp also keeps at a low voltage. Then, the voltage of the source of the transistor Mp is a high-leveled voltage because of connecting to the pad VDD while the voltage of the gate of the transistor Mp is a low-leveled voltage because of the affect of the pad VCC and the RC network. Because the voltage difference between the two nodes is higher than the threshold voltage of the transistor Mp (|Vth_Mp|), the trigger circuit 22 provides the triggering voltage of the pad VDD to the ESD clamp circuit 32. The ESD clamp circuit 32 is turned on as a conductive path with low resistance between the pads VDD and VCC according to the triggering signal, for the ESD current passing through.

When the trigger circuit 22 triggers the ESD clamp circuit 32, the voltage of the gate (the node Ni) is a high-leveled voltage and the voltage of the source of transistor Ma is a low-leveled voltage because of the pad VCC and the capacitor Cd. Thus, the transistor Ma is turned off and the transistor Mn of the reverse-trigger circuit 24 is also turned off. In other words, when the trigger circuit 22 triggers the ESD clamp circuit 32, the reverse-control circuit 26 and the reverse-trigger circuit 24 does not work in order to avoid interfering in the trigger from the trigger circuit 22 to the ESD clamp circuit 32.

Figure 4:
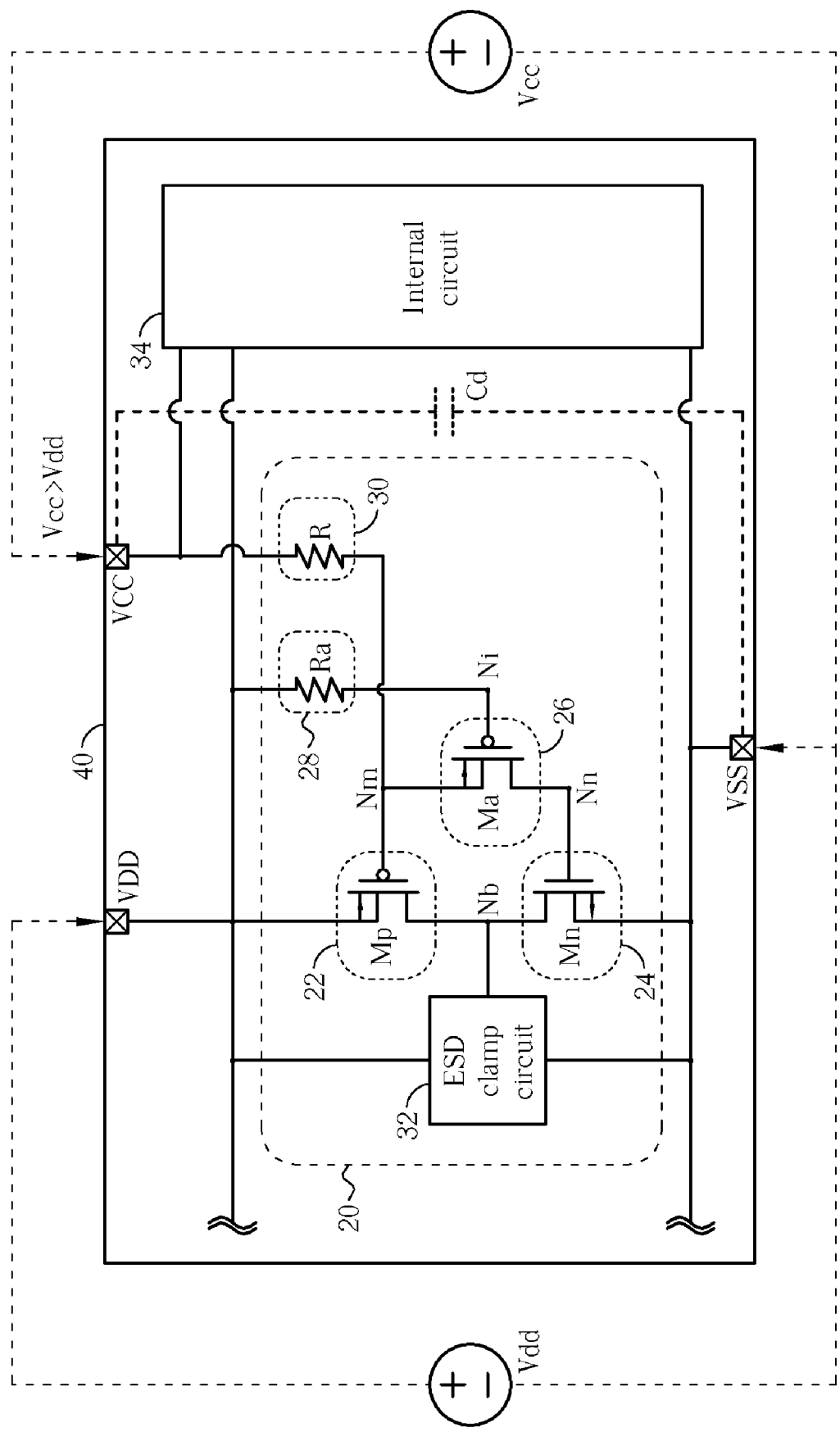
FIG. 4 is a diagram illustrating the regular operation of the circuit in FIG. 2.

Following the embodiments of FIG. 2 and FIG. 3, please refer to FIG. 4; FIG. 4 shows the regular operation of the chip 40 in FIG. 2. With regard to the protection circuit 20 of the present invention of FIG. 2, the pads VDD and VCC are respectively received with a higher voltage and a lower voltage, and when the chip is in exercising power-on procedure or is on regular operation, the pad VDD establishes the higher voltage more quickly while the pad VCC establishes the lower voltage more slowly. In other words, as shown in FIG. 4, the chip receives respectively voltages from external power supplies VDD and VCC through the pads VDD, VCC, and VSS, and the voltage of the pad VCC is higher than that of the pad VDD and that disables the transistor Mp of the trigger circuit to turn on. Thus, the trigger circuit 22 does not trigger the ESD clamp circuit 32 in order to avoid the regular operation of the chip 40. When the power-on phase is completed and the pads VDD and VCC start to receive steadily the driving voltages, the voltage difference between the pad VCC and the reference voltage at node Ni is in excess of the threshold voltage of the transistor Ma (|Vth_Ma|) to turn the transistor Ma on. Thus, the voltage of the node Nn is at a high-leveled voltage to turn the transistor Mn on. And because the transistor Mn is turned on, the reverse-trigger circuit 24 makes the voltage of the node Nb keep at a low-leveled voltage to continuously prevent the ESD clamp circuit 32 from being triggered. In other words, turning on the transistor Ma of the reverse-control circuit 26 equals transmitting a reverse-control signal of high voltage to the node Nn, and the reverse-control signal activates the reverse-trigger circuit 24 to prevent the ESD clamp circuit 32 from being triggered. Thus, the interference of the ESD clamp circuit 32 is avoided from the regular operation of the chip 40. As the circuit placement shown in FIG. 4, the transistor Mp of the trigger circuit is unable to turn-on, and the controlled node of the ESD clamp circuit at the node Nb is dominated by the reverse-trigger circuit 24.

Combining FIG. 2 with FIG. 3 and FIG. 4, we know it is not necessary to put an actual capacitor device in the protection circuit of the present invention. When the voltage of the pad VDD rises rapidly induced by ESD events, the present invention directly uses the intrinsic capacitor between the power pad VCC and the ground pad VSS to keep the low-leveled voltage of the power pad VCC and to use the voltage difference between the pads VDD and VCC to activate the trigger circuit and the ESD clamp circuit. With regard to the embodiments from FIG. 2 to FIG. 4, the pads VDD and VCC may be isolated from each other; or be connected through one or more diodes connected in series to keep an appropriate voltage difference between the two pads when ESD events happen.

Figure 5:
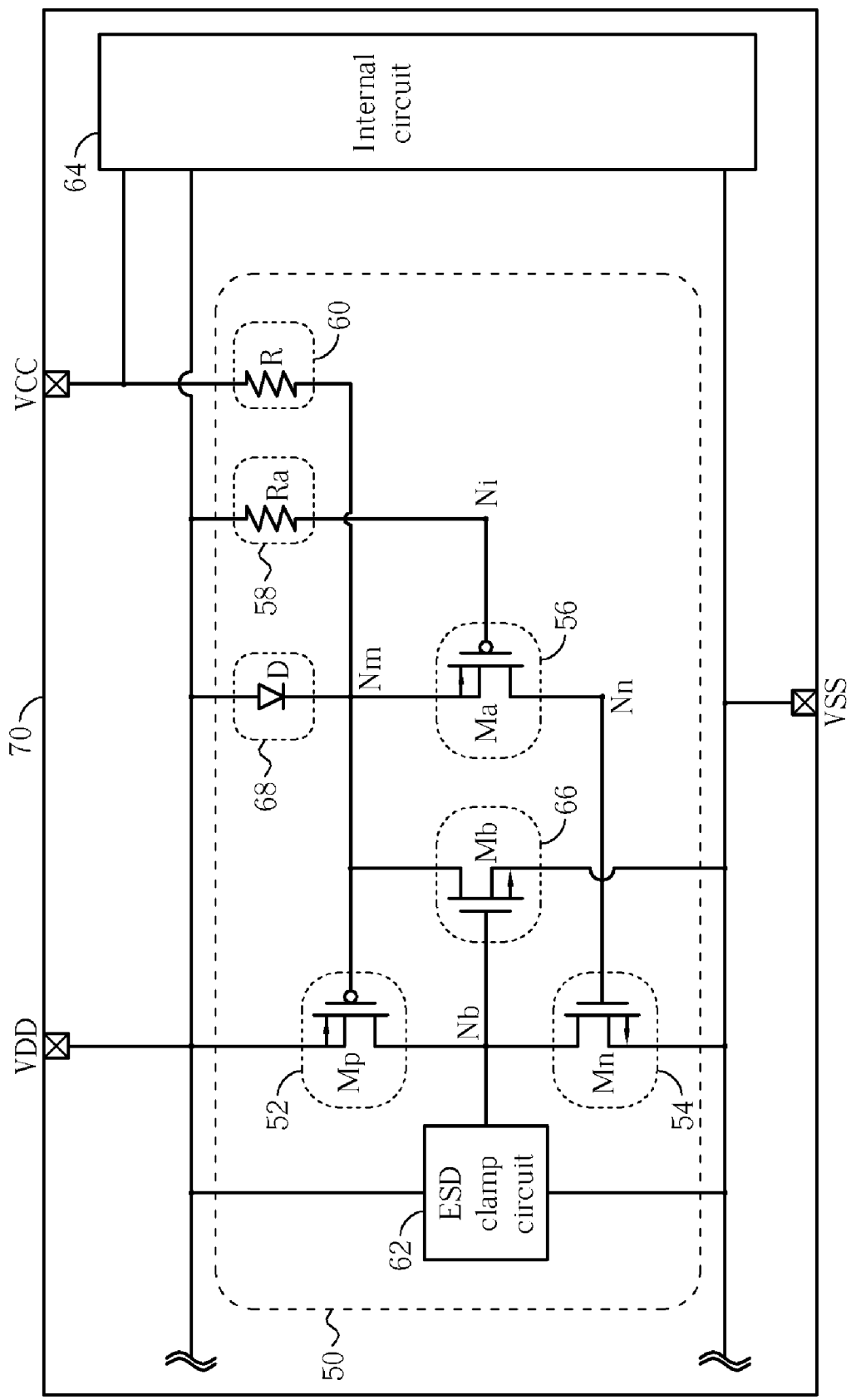
FIG. 5 is a diagram illustrating the circuit placement of another embodiment of the protection circuit of the present invention.

Please refer to FIG. 5, which is a circuit diagram illustrating another embodiment 50 of the present invention. The chip 70 comprises the pads VCC and VDD (as power pads) and the pad VSS (as ground pad) providing the internal circuit 64 of the chip 70 with different electrical potentials from the external power supplies. The protection circuit 50 is disposed between the three pads to provide the protection against ESD events. Similar to the embodiment of FIG. 2, the protection circuit 50 of FIG. 5 also comprises a trigger circuit 52, a reverse-trigger circuit 54, a reverse-control circuit 56, an ESD clamp circuit 62, a transmission circuit 60, and an adjustment circuit 58. And, the protection circuit 50 further comprises another auxiliary circuit 66. Additionally, an intermediate circuit 68 is disposed between the pad VDD and the node Nm. As shown in FIG. 5, the auxiliary circuit 66 comprises an NMOS transistor Mb, and the gate of the transistor Mb connects to the node Nb, which is as controlled by the voltage of the node Nb as the ESD clamp circuit 62. The drain and source of the transistor Mb separately connect between the nodes Nm and Nn. The intermediate circuit 68 comprises one diode D or many diodes connected in series.

Figure 6:
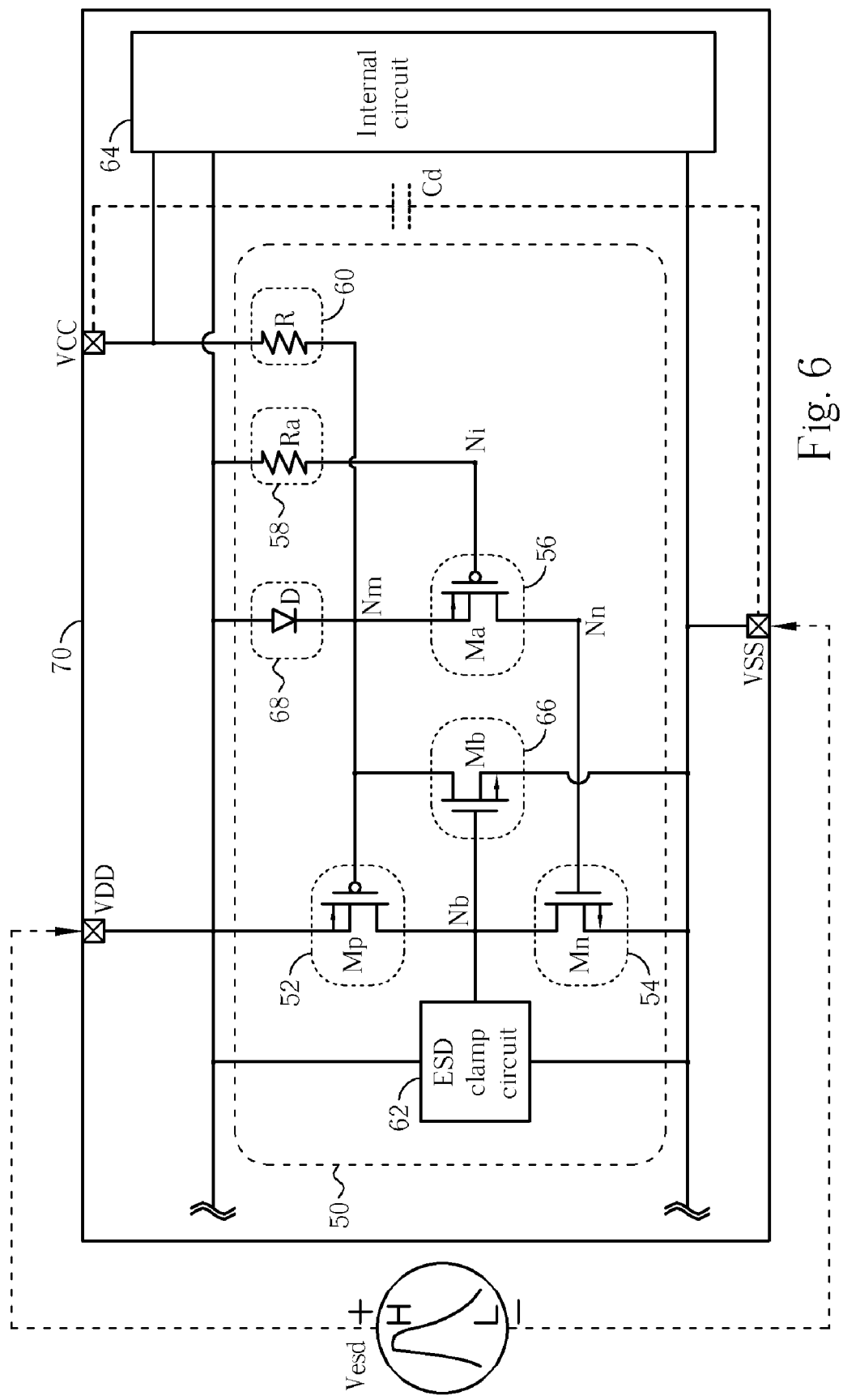
FIG. 6 is a diagram illustrating ESD events happening to the circuit in FIG. 5.

Please continue referring to FIG. 6, which shows ESD events happening to the chip 70 of FIG. 5. When the pads VDD and VSS of the chip 70 accidentally contact an ESD power source Vesd, the voltage of the pad VDD rises rapidly comparing to the voltage of the pad VSS. Similar to the previous embodiment of the present invention, the voltage of the pad VCC is kept at a low-leveled voltage due to the intrinsic capacitor between the pads VCC and VSS. Meanwhile, the intermediate circuit 68 helps and ensures the enough voltage difference between the pads VDD and VCC. The voltage difference between the pads VDD and VCC turns on the transistor Mp through the pad VDD and the node Nm. Thus, the trigger circuit 52 generates a high-leveled triggering signal at the node Nb to turn on the ESD clamp circuit for bypassing the ESD current between the pads VDD and VSS.

Please notice that the pad VCC is floating when ESD events happen between the pads VDD and VSS. The voltage difference between the pad VDD and the pad VCC may be enable to turn the trigger circuit 52 on when the electric potential accumulated in the pad VCC or other condition. However, the auxiliary circuit 66 is also triggered by the triggering signal generated by the trigger circuit 52. The triggered auxiliary circuit 66 provides a conductive path between the pads VCC and VSS to lower the voltage of the node Nm and that of the pad VCC. In other words, the auxiliary circuit 66 ensures that the voltage difference between the pad VDD and VCC is able to turn the trigger circuit 52 on.

In other words, when an ESD event happens, the voltage across the pads VDD and VCC is increased to trigger the ESD clamp circuit 62 faster and more completely to provide better ESD protection due to the auxiliary circuit 66.

Figure 7:
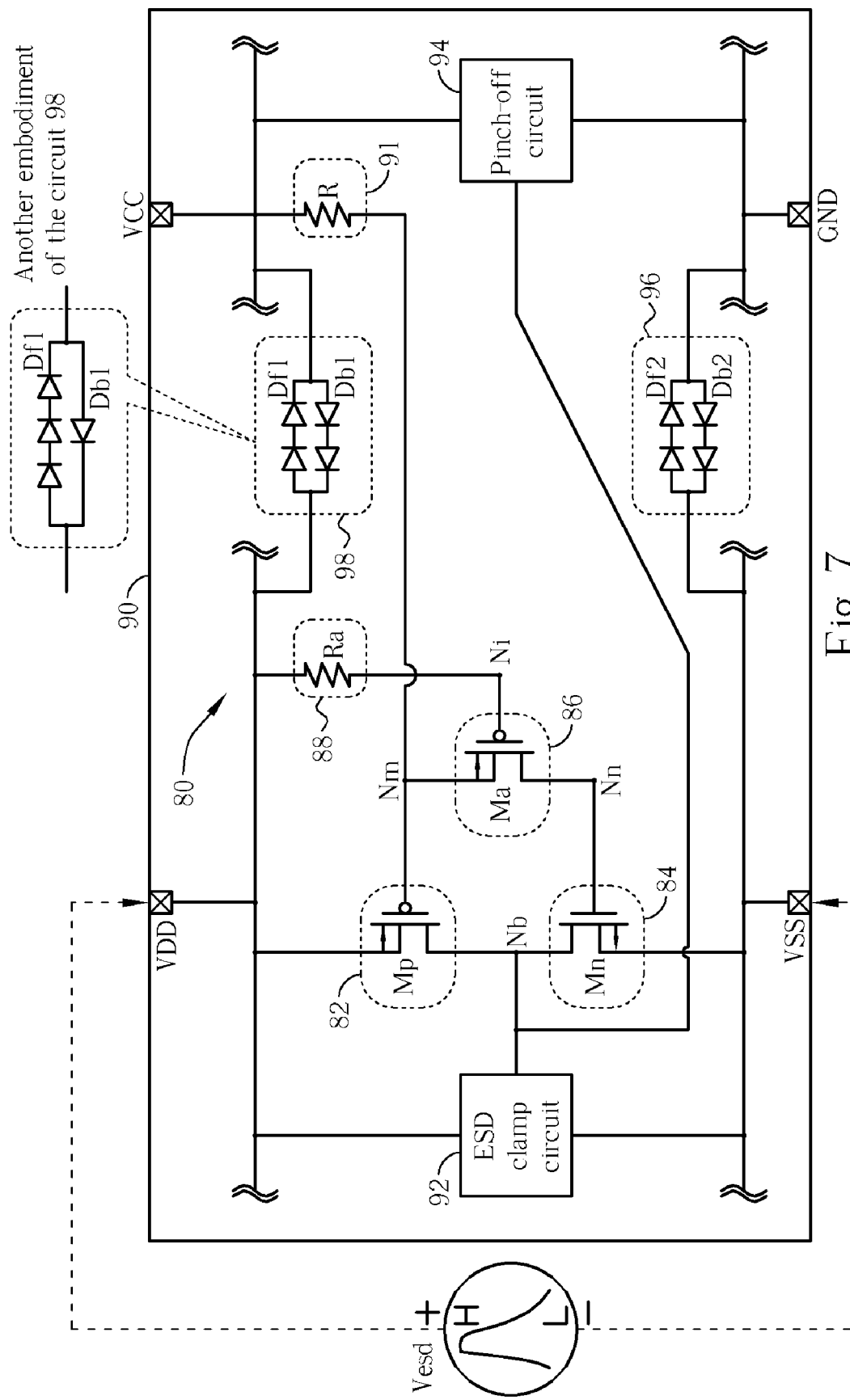
FIG. 7, FIG. 8, and FIG. 9 show the different embodiments of the protection circuit of the present invention.

Please refer to FIG. 7, which is a circuit diagram illustrating another embodiment 80 of the protection circuit of the present invention. The protection circuit 80 is disposed in the chip 90 which has two power pads VCC, VDD and two ground pads VSS, GND. During the regular operation of the chip 90, the pads VCC and VDD respectively provide the chip 90 with two different positive voltages, and the pads VSS and GND provide the chip 90 with the separately ground paths. The protection circuit 80 of the present invention is disposed between the four pads to protect ESD events between the pads VDD and VSS. Similar to the circuit placement in FIG. 5, the protection circuit 80 in FIG. 7 comprises a trigger circuit 82, a reverse-trigger circuit 84, a reverse-control circuit 86, an ESD clamp circuit 92, a transmission circuit 91 and an adjustment circuit 88. Besides the ESD clamp circuit 92 between the pads VDD and VSS, another ESD clamp circuit 94 is further disposed between the pads VCC and GND, and the ESD clamp circuit 94 connects to the node Nb as the controlled node as well as the ESD clamp circuit 92. Thus, the ESD clamp circuit 92 and the ESD clamp circuit 94 could be triggered according to the same triggering signal.

On the other hand, the intermediate circuit 98 is disposed between the pads VDD and VCC while another intermediate circuit 96 is equipped between the pads VSS and GND. As shown in FIG. 7, the intermediate circuit 98 would be a diode ring which comprises a series diodes Df1 and a series diodes Db1 connected in parallel. Similarly, the intermediate circuit 96 would be a diode ring which comprises a series diodes Df2 and a series diodes Db2 connected in parallel.

The function of the ESD clamp circuit 94 in FIG. 7 is the similar to the auxiliary circuit shown in FIG. 6. When an ESD event happens, the ESD clamp circuit 94 helps the ESD clamp circuit 92 to increase the activating response for the ESD event. More particularly, when an ESD power source accidentally contacts the pads VDD and VSS and the ESD event happens, the voltage of the pad VDD raises rapidly and the voltage of the pad VCC keeps at a lower voltage. And the voltage difference between the pads VDD and VCC makes the transistor Mp of the trigger circuit 82 generates a high-leveled triggering signal at the node Nb and to the ESD clamp circuits 92 and 94. The ESD clamp circuit 92 lowers the voltage of the pad VCC to be close to the voltage of the pad GND by providing a conductive path between the pads VCC and GND in accordance with the triggering signal from the trigger circuit 82. Through the bridging of the intermediate circuit 96, the voltage of the pad GND is close to the voltage of the pad VSS. Thus, the ESD clamp circuit 94 increases the voltage difference between the pads VDD and VCC and feeds back to the ESD clamp circuits 92 to increase the activating response for ESD events.

In the protection circuit 80, the intermediate circuit 98 connected to the pads VCC and VDD realizes a specific electrical relationship of the two pads. The series diode Df1 of the intermediate circuit 98 ensures enough voltage difference between the pads VDD and VCC to turn on the transistor Mp of the trigger circuit 82 during the ESD protection. On the other hand, during the regular operation of the chip 90, each diode in series diode Df1 of the intermediate circuit 98 and each diode in series diode Db1 are used to keep the coupling between the pads VDD and VCC. Another embodiment of the intermediate circuit 98 is illustrated in FIG. 7, which comprises a series diode Df1 with more diodes between the pads VDD and VCC. On the one hand, it is used as the electrical coupling path between the pads VDD and VCC. On the other hand, it ensures the activation of the ESD protection. The series diode Db1 is used as the electrical coupling path between the pads VCC and VDD.

The intermediate circuit 98 further prevents the possibility of the mis-trigger of the trigger circuit 82 during the initiation or power-on procedure of the chip. More particularly, during the initiation or power-on procedure of the chip, if the voltage of pad VCC is established higher and faster than the voltage of the pad VDD, the voltage of the pad VDD is raised by the intermediate circuit 98. The series diode Db2 of the intermediate circuit 98 ensures enough voltage difference between the pads VDD and VCC to prevent the transistor Mp of the trigger circuit from being turned-on for avoiding the mis-trigger of the trigger circuit 82.

Figure 8:
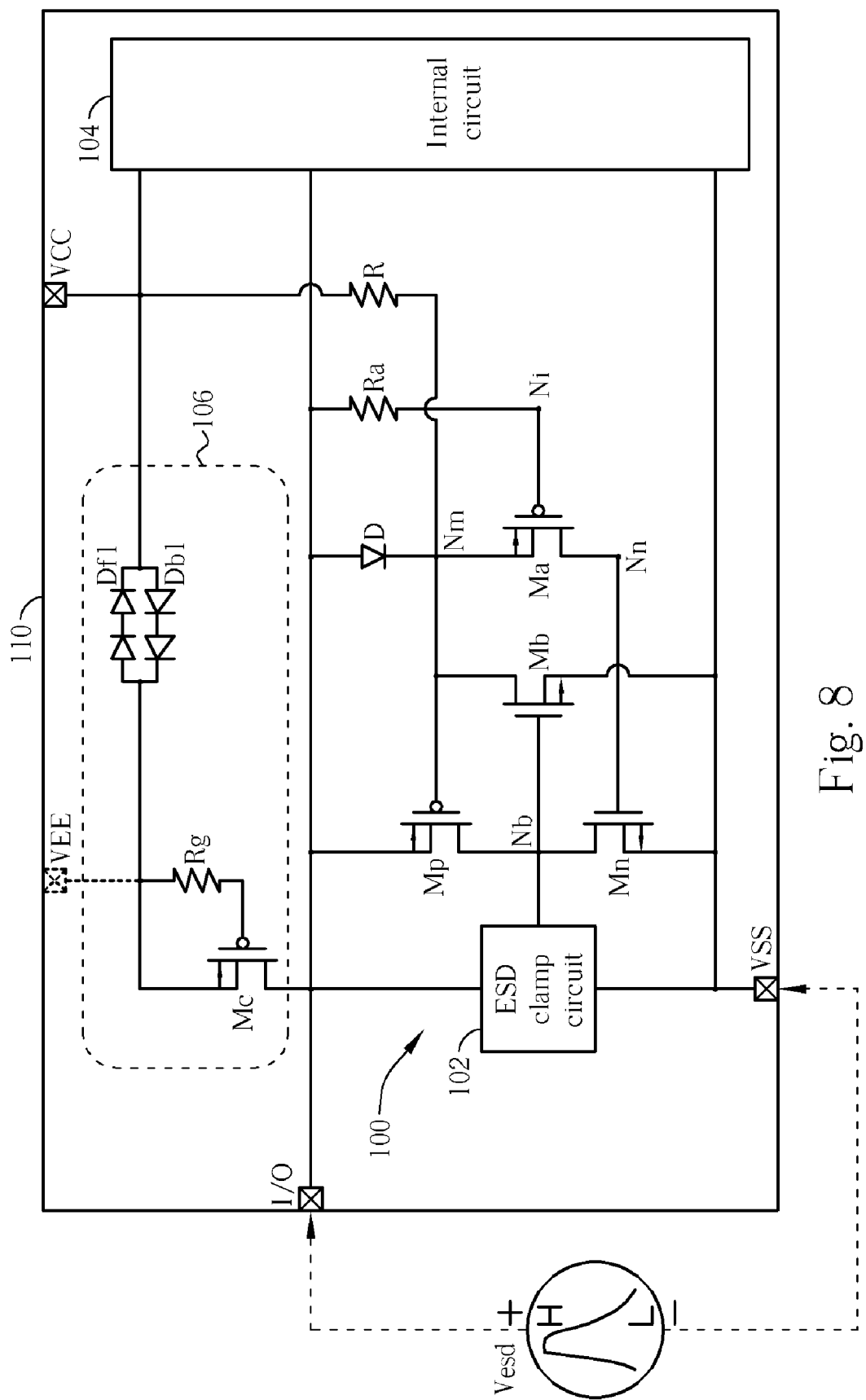

The embodiments of the present invention above take the power pads as examples to illustrate how the ESD protection circuits protect power pads. However, the techniques of the present invention are also used to protect the signal input and output pads. Please refer to FIG. 8, FIG. 8 shows another embodiment 100 of the protection circuit of the present invention. The protection circuit 100 is disposed in the chip 110. The chip 100 is equipped with the pads VCC and VSS, which serve as the power pad and the ground pad respectively. And the pad I/O is a signal input/output pad to enable the internal circuit 104 to exchange signals with other external chips/circuits (including receiving signals and transmitting signals). To protect the pad I/O from ESD events, the protection circuit 100 is set up between the pads I/O, VCC and VSS.

As shown in FIG. 8, the protection circuit 100 comprises a trigger circuit with a transistor Mp, a reverse-trigger circuit with a transistor Mn, a reverse-control circuit with a transistor Ma, an auxiliary circuit with a transistor Mb, a transmission circuit with a resistor R, an adjustment circuit with a resistor Ra, an intermediate circuit 106 disposed between the pads VCC and I/O, and an ESD clamp circuit 102 disposed between the pads I/O and VSS. The transistor Ma triggers the ESD clamp circuit 102 from the node Nb according to the voltage difference between the pads I/O and VCC to protect the pad I/O while the transistor Mb as the auxiliary circuit speeds up and deepens the conductive level of the ESD clamp circuit 102. During the regular operation of the chip 11, the transistor Ma as the reverse-control circuit and the transistor Mn as the reverse-trigger circuit, are both turned on to stop the ESD clamp circuit 102 from being turned on. On the other hand, the intermediate circuit 106 comprises a PMOS transistor Mc, a resistor Rg, and a plurality of diodes Df1 and Db1, and the intermediate circuit 106 connects to another power pad VEE. In addition, the intermediate circuit with the diode D is disposed between the pads I/O and VCC.

When an ESD event happens between the pads I/O and VSS, the voltage of the pad I/O rises rapidly. At the same time, the voltage of the pad VCC keeps at a lower voltage because of the capacitors between the pads VCC and VSS and the affect of the intermediate circuit (with diode D). Thus, the voltage difference between the pads I/O and VCC turns the transistor Mp on to generate a triggering signal to the ESD clamp circuit 102. Thus, the ESD clamp circuit 102 is turned on to provide a conductive path with low impendence between the pads I/O and VSS and to bypass the ESD currents.

With regard to the embodiment in FIG. 8 of the present invention, the peak value of the input/output signals at the pad I/O may be lower than the received voltage of the pad VCC. During the initiation and power-on procedure of the chip 110, the voltage of the pad VCC rises and the voltage of the pad I/O is close to the ground voltage because the chip 110 does not start to input and output signals. In addition, the voltage of the pad VCC is higher than the voltage of the pad I/O and the transistor Mp as the trigger circuit is not turned on. Thus the ESD clamp circuit 102 is not triggered to be turned on in order to avoid interfering with the power-on procedure of the chip. After the power-on procedure is completed, when the chip 110 operates regularly, the voltage of the pad VCC is higher than the peak value of the signals at the pad I/O by a value that is enough to make the transistor Ma turned-on. The turned-on transistor Ma connects the high-leveled voltage of the pad VCC to the node Mn and makes the transistor Mn turned-on. Consequently, the turned-on transistor Mn avoids interfering the regular operation of the chip 110 by lowering the signal at the node Nb to the low-leveled voltage of the pad VSS to keep the ESD clamp circuit 102 from being triggered and turned on.

Figure 9:
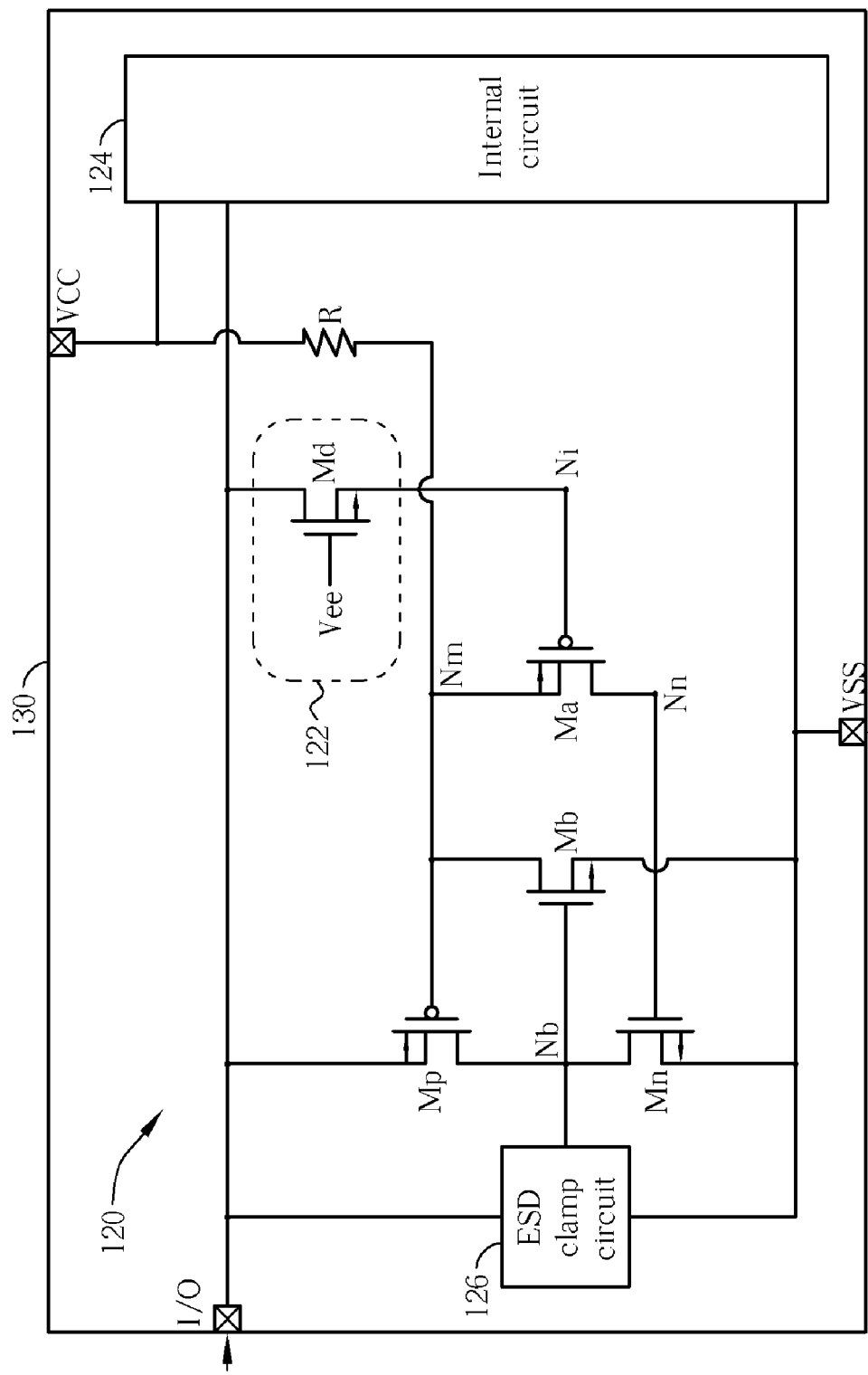

Please refer to FIG. 9. The placement of another protection circuit 120 in a chip 130 of the present invention is illustrated in FIG. 9. Similar to the embodiment in FIG. 8, the protection circuit 120 in FIG. 9 is also disposed between the power pad VCC, the ground pad VSS, and the signal input/output pad I/O to protect the pad I/O from ESD events. The protection circuit 120 comprises a trigger circuit with a transistor Mp, a reverse-trigger circuit with a transistor Mn, a reverse-control circuit with a transistor Ma, an auxiliary circuit with a transistor Mb, a transmission circuit with a resistor R, a ESD clamp circuit 126 disposed between the pads I/O and VSS, and an adjustment circuit 122 is disposed between the pad I/O and the node Ni. In this embodiment, the adjustment circuit 122 comprises an NMOS transistor Md. During the regular operation of the chip 130, the gate of the transistor Md is provided with a voltage Vee, which is generated by an external circuit or the internal circuit 124. And the adjustment 122 provides a corresponding reference level (also named as a reference signal) at the node Nd in response to the signal at the pad I/O, and this reference signal is the result of the truncation to the signals of the pad I/O.

More particularly, during the regular operation of the chip, the voltage difference between the pads I/O and VCC is lower than the threshold voltage of the transistor Ma (|Vth_Ma|), which disables the transistor to conduct and to generate the reverse-control signal to the transistor Mn. In the present embodiment, a corresponding reference voltage lower than or equaling to a third predetermined value keeps the transistor turned on. During the regular operation of the chip 130, the transistor Ma transmits a reverse-control signal to the transistor Mn to prevent the ESD clamp circuit 126 from being triggered and turned on.

Figure 10:
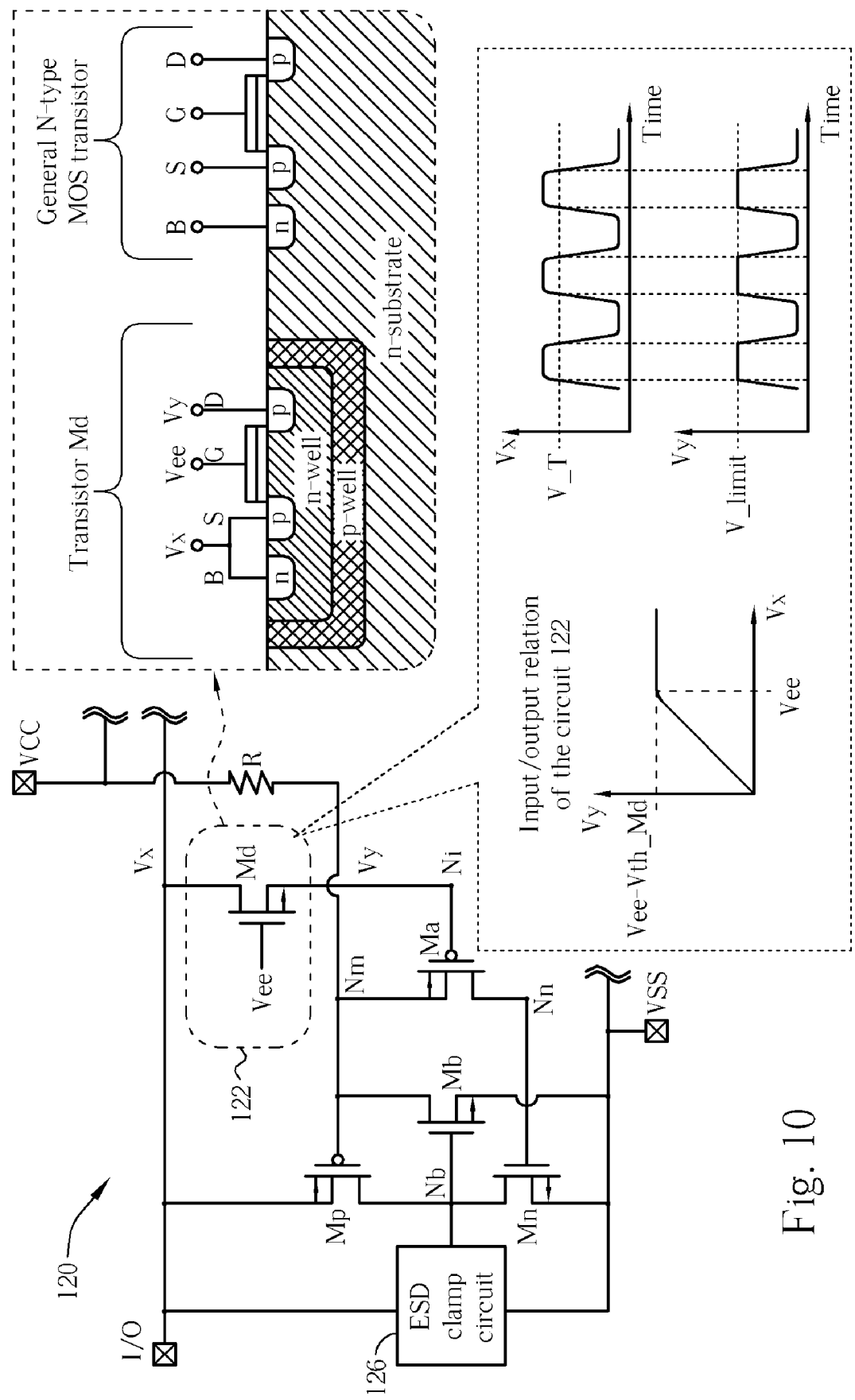
FIG. 10 is a diagram further illustrating the operation theory and the way it is realized of the circuit in FIG. 9.

As for the operating theory of the adjustment circuit 122 shown in FIG. 9, please further refer to FIG. 10. If taking the signal voltage of the pad I/O as input Vx and the reference signal voltage of the node Ni as output Vy, the input/output relation (the transformation curve) of the adjustment circuit 122 is shown in FIG. 10. When the input Vx is lower than the gate voltage Vee of the transistor Md, the output Vx is followed to the input Vx by the adjustment circuit 122, for example the output Vy is equal to the input Vx. But when the input Vx is higher than the gate voltage Vee of the transistor Md, the adjustment circuit 122 limits the output Vx to a third predetermined value which is the difference of the gate voltage Vee of the transistor Md and the threshold voltage of the transistor Md (Vee−|Vth_Ma|). As discussed before, during the regular operation, the transistor Ma as the reverse-control circuit keeps turned on to prevent the ESD clamp circuit 126 from being triggered through the reverse-trigger circuit (the transistor Mn). To keep the conduction of the transistor Ma, the voltage of the node Ni is lower than the voltage of the pad VCC by less than the threshold voltage of the transistor Ma (Vth_Ma). Because of the operation of the adjustment circuit 122, the maximum voltage of the node Ni is not higher than the third predetermined value, which ensures enough voltage difference between the pad VCC and the node Ni to keep the transistor Ma turned on.

In other words, because the adjustment circuit 122 limits the signal of the pad I/O for the reference signal, the adjustment circuit 122 still keeps the transistor Ma turned on, which disables the ESD clamp circuit 126 from being turned on.

On the other hand, the transistor Md is adopted with the multi-well NMOS transistors. FIG. 10 draws the diagram of the multi-well structure. As shown in the diagram, each pole of the multi-well NMOS transistor (including the source S, the gate G, the drain D and the bulk B) is established on an n-well surrounded with a p-well to separate the bulk B and the n-substrate. In this way, even though the bulk B and the source S of the transistor Md both connect to the pad I/O, the voltage of the n-substrate is not interfered with and the leakage current is not conducted between the bulk B and the p-substrate of the transistor Md. Comparing with it, each source S, gate G, drain D, and bulk B of the normal NMOS (such as the transistors Mp or Ma) is established on the n-substrate. As shown in FIG. 10, the multi-well MOS transistors could be fabricated through the semiconductor process technology.

Figure 11:
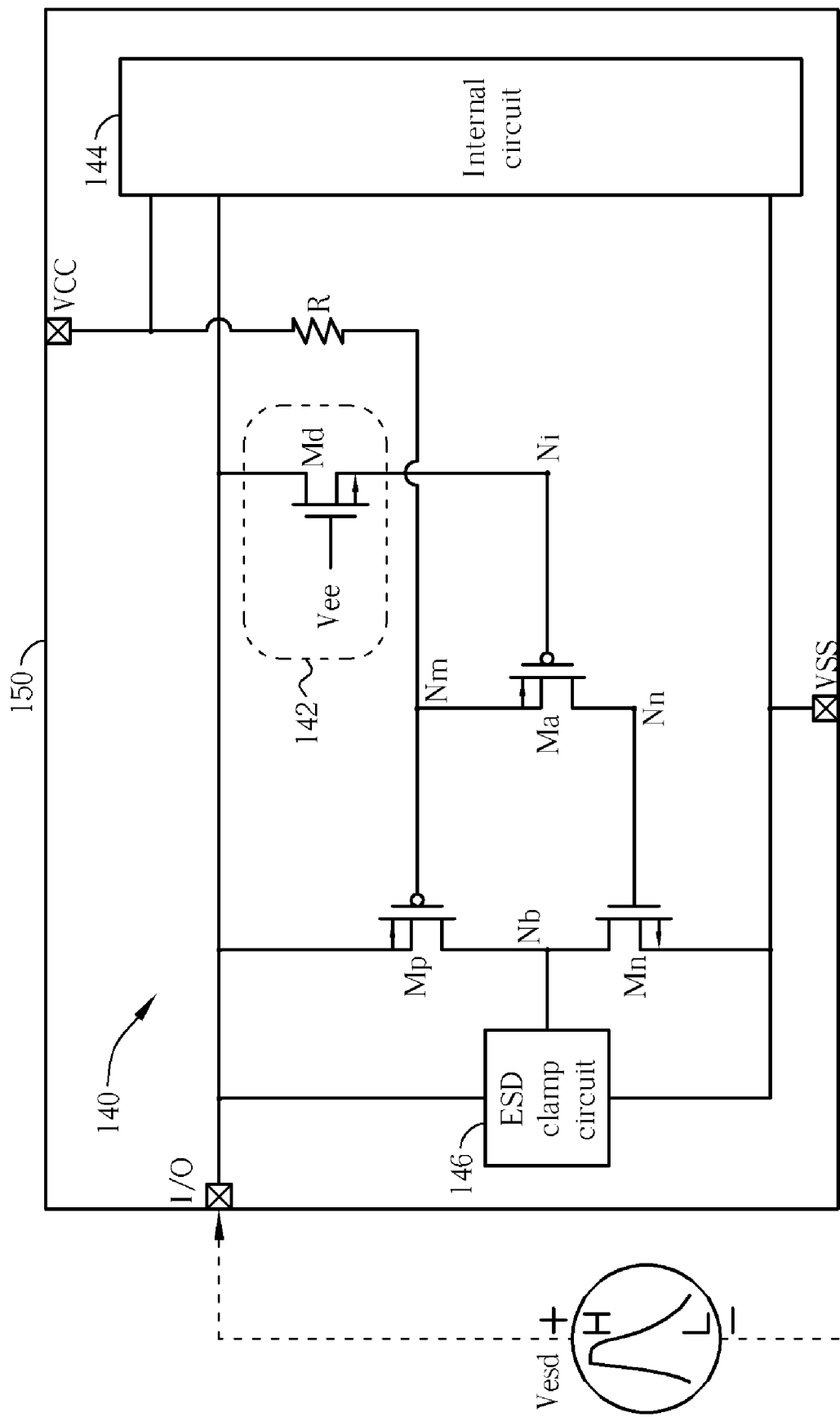
FIG. 11, FIG. 12, and FIG. 13 individually show the different embodiments of the protection circuit of the present invention.
Figure 12:
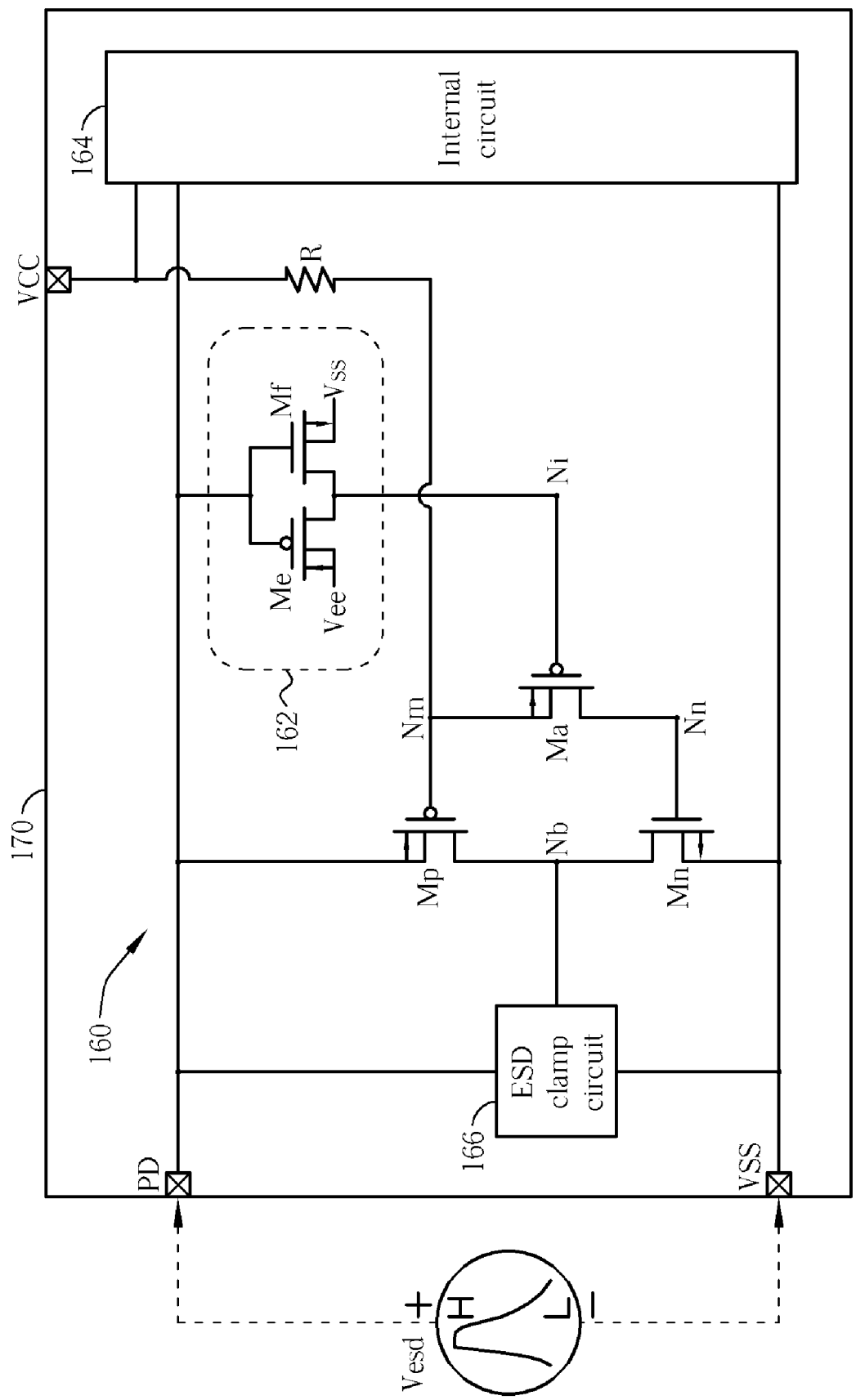

Please refer to FIG. 12 showing a protection circuit 160 of the present invention disposed in a chip 170. The protection circuit 160 is between the pad VCC (as a power pad), the pad VSS (as a ground pad), and the pad PD to protect the pad PD. The pad PD may be a signal input/output pad or another power pad (such as the pad VDD) to receive another voltage different from the pad VCC. Similar to the circuit placement in FIG. 11, the protection circuit 160 comprises a trigger circuit with the transistor Mp, a reverse-control circuit with the transistor Mn, a reverse-control circuit with the transistor Ma, a transmission circuit with the resistor R, and an ESD clamp circuit. An adjustment circuit 162 is disposed between the pad PD and the reverse-control circuit (the transistor Ma). In this embodiment, the adjustment circuit 162 forms an inverter using a PMOS transistor Me and an NMOS transistor Mf. The sources of the two transistors Me and Mf are respectively biased at the voltages Vee and VSS. The voltage of the pad PD serves as the input of the inverter, and the voltage of the node Ni serves as the output of the inverter, which is the reference voltage signal of the reverse-control circuit (transistor Ma). During the regular operation of the chip 170, the voltages Vee and Vss are provided (such as by the internal circuit 164) to operate the adjustment circuit 162. And during the operation of the adjustment circuit 162, no matter what the voltage of the pad PD is, the adjustment circuit 162 limits the voltage of the node Ni between the voltages Vee and Vss.

When an ESD power source Vesd accidentally contacts the pads PD and VSS, the ESD clamp circuit 166 is triggered to being a conductive path with low resistance between the two pads for ESD currents, similarly to the embodiment in FIG. 2. During the regular operation of the chip, the adjustment circuit 162 limits the voltage of the node Ni between the voltages Vee and Vss. In other words, as long as the voltage Vee is ready, the voltage difference between the nodes Nm and Ni is enough to keep the transistor turned on and to keep the ESD clamp circuit 166 from being triggered by the turned-on transistor Mn to interfere with the regular operation of the chip 170. When realizing the adjustment circuit 162 in FIG. 12, because the source and the bulk of the transistor Me are both biased at the voltage Vee, the transistor Me is a normal PMOS transistor instead of the necessary multi-well PMOS transistor, which is similar to the embodiment shown in FIG. 10.

Figure 13:
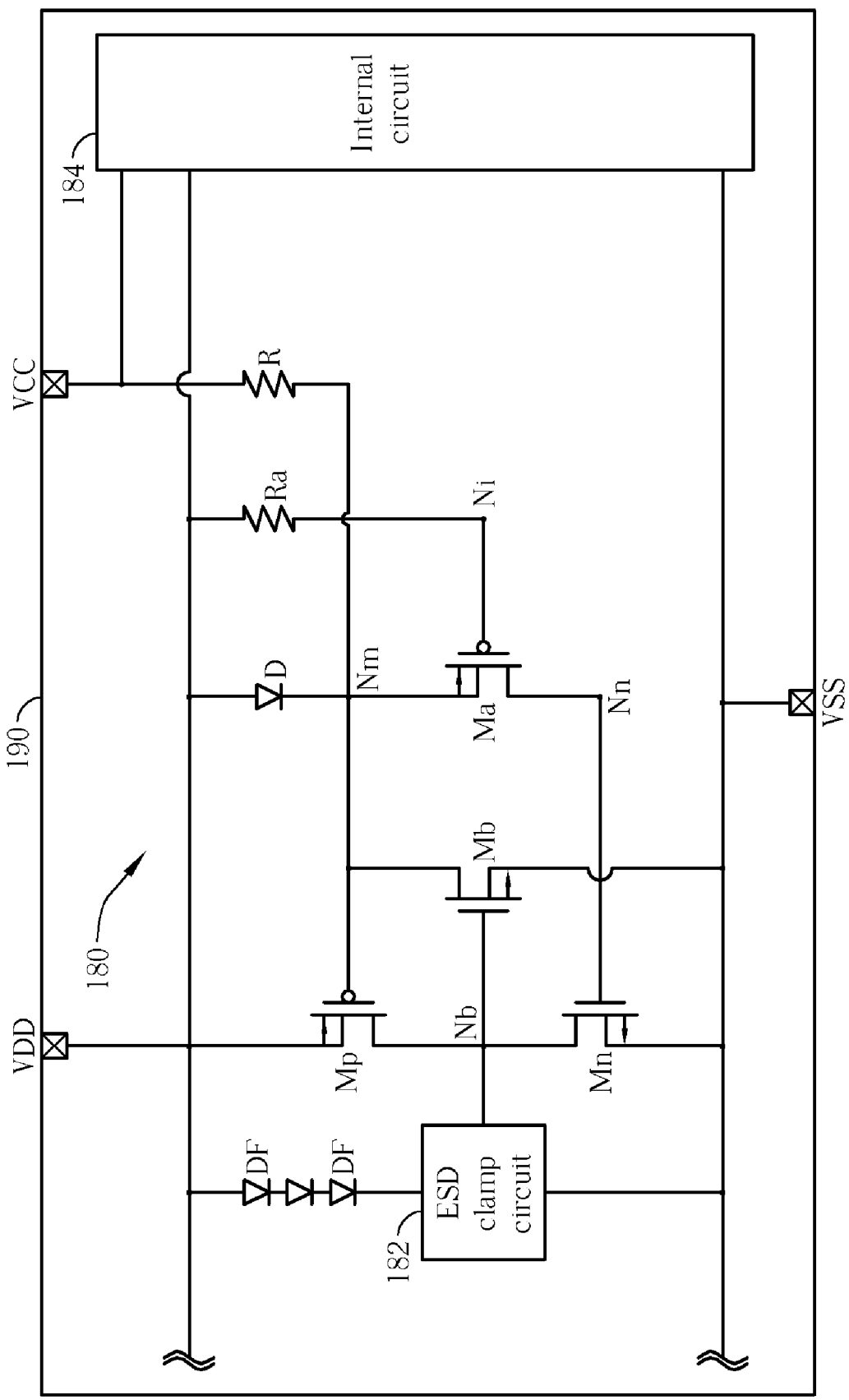

Please refer to FIG. 13 illustrating the consideration of the design and operation of the ESD clamp circuit of the present invention by using the circuit in FIG. 5. In the example of FIG. 13, the protection circuit 180 protects the pad VDD and the internal circuit 184 from the damage caused by ESD events by continuing to use the related circuit placement of the protection circuit 50 in FIG. 5. The embodiment of FIG. 13 further comprises one or many additional diodes DF are connected between the ESD clamp circuit 182 and the protected pad (the pad VDD). The diodes DF are used to prevent latch-up in the ESD clamp circuits. For instance, the ESD clamp circuit 182 is a silicon-controlled rectifier (SCR). As known by those skilled in the art, the current-voltage characteristic curve of the SCR has a holding region, in which region the voltage of the SCR keeps a stable voltage V_hold without regard to the increasing current passing through the SCR. However, during the regular operation of the chip, sometimes the ESD clamp circuit 182 is accidentally triggered and then turned on without recovering back to the former condition itself, which interferes the regular operation of the chip and is so called latch-up. To prevent the latch-up, the series diodes DF are disposed as shown in FIG. 13. The characteristic holding voltage V_hold of the SCR plus the voltage sum of the diodes coupled to the SCR (N×V_DF, N=amount of the diodes, V_DF=the voltage of the diode) is higher than the voltage of the pad VDD, i.e. V_hold+N×V_DF>VDD. Thus, as long as selecting appropriate amount and character of diodes, the latch-up is prevented. Even though the ESD clamp circuit 182 is accidentally triggered during the regular operation, the ESD clamp circuit 182 recovers back to be turned off because of the lack of power. In each embodiment of the present invention from FIG. 2 to FIG. 12, it is used in this way to ensure the regular operation of the chip.

In summary, in order to protect a protected pad against ESD events, the present invention uses the intrinsic capacitors between the other power pads and ground pads to provide a sufficient low-leveled voltage, and uses the voltage difference of the protected pad and the low-leveled voltage of the other power pad to trigger ESD clamp circuit and to activate ESD protection. Comparing with the conventional ESD protection circuit, the present invention effectively uses the intrinsic capacitor in the chip, so the protection circuit of the present invention does not have to add capacitors and thus the layout area of the ESD protection circuit is reduced to further realize the ESD protection more economically. In each embodiment of present invention from FIG. 2 to FIG. 13, each related circuit is replaced by other equivalent circuits. For instance, the designs of the inter circuits (such as intermediate circuits 68, 98 and 106) of different pads of the present invention disclosed in FIG. 5, FIG. 7, and FIG. 8 can be exchanged with each other (for instance, intermediate circuit 98 in FIG. 7 is replaced by the intermediate circuit 68 in FIG. 5). Besides, the two different adjustment circuits 122 and 162 respectively disclosed in FIG. 9 and FIG. 12 also can be exchanged with each other. For instance, replace the adjustment circuit 122 in FIG. 9 with the inverter adjustment circuit 162 in FIG. 12. The ESD clamp circuit in each embodiment can be realized with the NMOS transistor or the SCR.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A protection circuit for bypassing a current induced by an ESD event, the protection circuit comprising:
   a trigger circuit coupled between a first pad and a second pad for comparing a voltage of the first pad and a voltage of the second pad; wherein the trigger circuit generates a triggering signal when the voltage difference between the first pad and the second pad is exceeds to a first predetermined value; and
   an ESD clamp circuit coupled to the first pad and the third pad equipped with a controlled node, the ESD clamp circuit serves as a conductive path between the first pad and the third pad when the controlled node of ESD clamp circuit receives the triggering signal;
      wherein the second pad is coupled to an decoupling capacitor, and the voltage of the second pad is lower than the voltage of the first pad by less than the first predetermined value when the ESD event happens between the first pad and the third pad.

2. The protection circuit of claim 1, wherein the first pad provides a first voltage and the second pad provides a second voltage, and the trigger circuit stops from generating the trigger when the second voltage higher than the first voltage.

3. The protection circuit of claim 1 further comprising a transmission circuit coupled to the trigger circuit and the second pad for transmitting the voltage of the second pad to the trigger circuit.

4. The protection circuit of claim 3 wherein the transmission circuit is a resistor.

5. The protection circuit of claim 1 wherein the controlled node is coupled to the first pad to use the voltage of the first pad as the triggering signal.

6. The protection circuit of claim 1 further comprising:
   a reverse-control circuit coupled to the second pad, wherein the reverse-control circuit generates a reverse-control signal when the voltage of the second pad is higher than a reference voltage and the difference between the two voltages is higher than a second predetermined value; and
   a reverse-trigger circuit coupled to the trigger circuit and the reverse-control circuit; wherein the reverse-trigger circuit stops the trigger circuit from generating the triggering signal when receiving the reverse-control signal.

7. The protection circuit of claim 6 further comprising an adjustment circuit coupled to the first pad in response to the voltage of the first pad to provide the reference voltage.

8. The protection circuit of claim 7 wherein the adjustment circuit is a resistor.

9. The protection circuit of claim 7 wherein the adjustment circuit is an N-type transistor and the reference voltage is not higher than a third predetermined value, and the third predetermined value is the difference between the voltage of the gate of the N-type transistor and the threshold voltage of the N-type transistor.

10. The protection circuit of claim 7 wherein the adjustment circuit is an inverter to limit the reference voltage within a first predetermined voltage and a second predetermined voltage.

11. The protection circuit of claim 6 wherein the reverse-control circuit generates the reverse-control signal by coupling the reverse-control circuit to the second pad and using the voltage of the second pad as the reverse-control signal.

12. The protection circuit of claim 6 wherein the reverse-control circuit is a transistor and the second value is the threshold voltage of the transistor.

13. The protection circuit of claim 1 further comprising:
an auxiliary circuit coupled to the controlled node and the third pad; wherein the auxiliary circuit ensures that the voltage difference between the first pad and the second pad is able to turn the trigger circuit on when receiving the triggering signal.

14. The protection circuit of claim 1 wherein the trigger circuit is a transistor and the first predetermined value is the threshold voltage of the transistor.

15. The protection circuit of claim 1 further comprising at least a diode coupled to the ESD clamp circuit and the first pad in series.

16. The protection circuit of claim 1 further comprising: an intermediate circuit coupling to the first pad and the second pad to ensure the difference between the two voltages is higher than the first predetermined value.

17. A protection circuit protecting ESD events comprising:
a trigger circuit coupled to a first pad and a second pad for comparing the voltages of the first pad and the second pad, wherein the trigger circuit generates a triggering signal when the voltage of the first pad is higher than the voltage of the second pad and the difference between the voltages of two pads is higher than a first predetermined value;
an ESD clamp circuit coupled to the first pad and the third pad, wherein the ESD clamp circuit provides a conductive path between the first pad and the third pad when receiving the triggering signal;
a reverse-control circuit coupled to the second pad; wherein the reverse-control circuit generates a reverse-control signal when the difference between a voltage of the second pad and a reference voltage is higher than a second predetermined value; and
a reverse-trigger circuit coupled to the trigger circuit and the reverse-control circuit, wherein the reverse-trigger circuit stops the trigger circuit from generating the triggering signal when the reverse-trigger circuit receiving the reverse-control signal.

18. The protection circuit of claim 17, wherein the trigger circuit is a transistor, and the first predetermined value is the threshold voltage of the transistor.

19. The protection circuit of claim 17, wherein the reverse-control circuit is a transistor, and the second predetermined value is the threshold voltage of the transistor.

20. The protection circuit of claim 17, wherein the reverse-trigger circuit is a transistor of which the gate is used to receive the reverse-control signal and the drain is used to stop the trigger circuit from generating the trigger.

* * * * *